United States Patent [19]

Rose et al.

[11] Patent Number: 4,740,704

[45] Date of Patent: Apr. 26, 1988

[54] OMEGA-TYPE ELECTRON ENERGY FILTER

[75] Inventors: Harald Rose, Darmstadt; Stefan Lanio, Rossdorf, both of Fed. Rep. of Germany

[73] Assignee: Carl-Zeiss-Stiftung, Heidenheim, Fed. Rep. of Germany

[21] Appl. No.: 907,040

[22] Filed: Sep. 12, 1986

[30] Foreign Application Priority Data

Sep. 13, 1985 [DE] Fed. Rep. of Germany ....... 3532699

[51] Int. Cl.⁴ .......................... H01J 3/14; G21K 1/08
[52] U.S. Cl. .......................... 250/396 ML; 250/356 R
[58] Field of Search .................... 250/396 R, 396 ML; 219/121 EB, 121 EM

[56] References Cited

FOREIGN PATENT DOCUMENTS 2058485 5/1971 France ......................... 250/396 ML

OTHER PUBLICATIONS

*Optik*, Plies et al., 46, No. 1, Sep. 1976, pp. 75-92.
"Adaptation of a Magnetic Filtering Device on a One Megavolt Electron Microscope", Zanchi et al., *Optik*, 43, Nov. 1975, No. 5, pp. 455-501.

*Primary Examiner*—Bruce C. Anderson
*Attorney, Agent, or Firm*—Walter Ottesen

[57] ABSTRACT

The invention is directed to an image forming omega filter having pole pieces with straight edges which has good local resolution and very good energy resolution. The omega filter includes four deflection regions, with deflection angles greater than 90°.

9 Claims, 3 Drawing Sheets

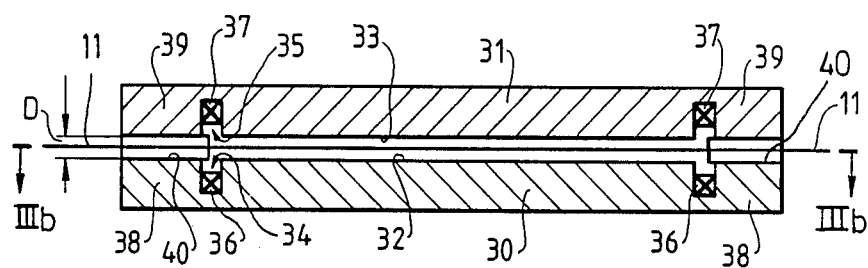
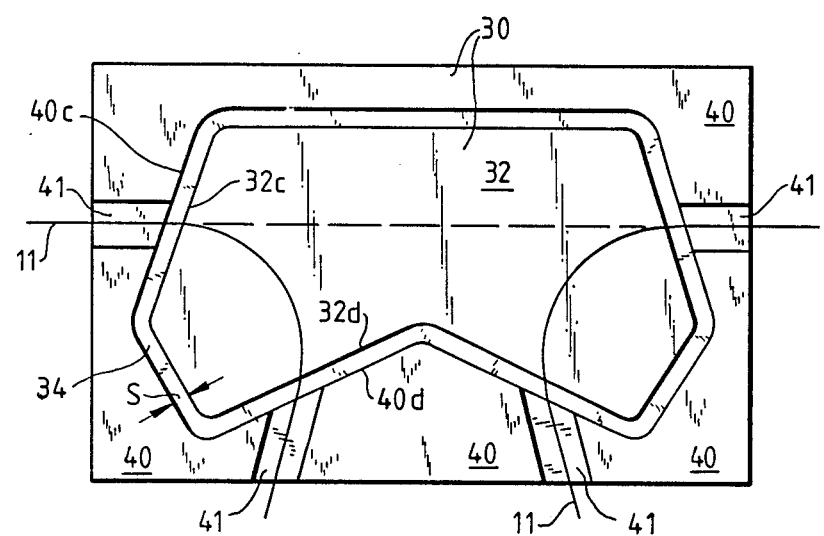

OMEGA-TYPE ELECTRON ENERGY FILTER

FIELD OF THE INVENTION

The invention relates to an imaging magnetic electron energy filter of the omega type, preferably for electron microscopes, with four deflection angles in magnetic fields.

BACKGROUND OF THE INVENTION

Imaging electron energy filters, also known as electron filters, energy filters, or electron energy spectrometers are used in transmission electron microscopes to improve the contrast of the image of the specimen by selecting electrons of a particular energy range. This is most clearly apparent with non-contrasting, very thin specimens having a selected energy loss ($\Delta E$) in the range of from approximately 100 to 200 eV. However, even an image of a specimen produced with purely elastically scattered electrons (energy loss $\Delta E=0$), which is done by filtering out any non-elastically scattered electrons ($\Delta E>0$), is markedly improved in contrast as compared with the unfiltered image.

A further substantial advantage of a transmission electron microscope having an imaging electron filter is that element-specific images (that is, element distribution images) can be made simultaneously over a relatively wide specimen range in that the energy range allowed to pass through the electron filter corresponds to an element-specific interaction of the transmitted electrons with the specimen, or in other words corresponds to a K, L or M absorption in the shell of the atom. Thus, it is possible to obtain qualitative distribution images, and quantitative distribution images as well if the intensity ratios are measured and the background is subtracted, of the elements in thin specimens ($\leq 30$nm) that have very high local resolution ($\approx 0.5$ nm) and maximum detection sensitivity ($\approx 2.10^{-21}$g); until now, this was unattainable by any other analysis technology. Maximum local resolution and maximum sensitivity of detection of elements are highly important both in biological and medical research and the study of materials.

In electron diffraction diagrams, as well, an imaging electron filter produces sharper images of the diffraction diagram by filtering out non-elastically scattered electrons. It is also possible to make diffraction diagrams of non-elastically scattered electrons in a particular energy range.

German Pat. No. 20 28 357 discloses an electron microscope which enables filtering of the image of the specimen or of the image of the diffraction diagram. An electron filter that comprises a magnetic prism and an electrostatic mirror is used. The electrostatic mirror, however, is highly sensitive to external stray fields; moreover, at high diffraction voltages for the electrons, problems of insulation also arise. For this reason, purely magnetic filters have been preferred of late. These energy filters are classified as so-called alpha and omega filters in accordance with the course of the electron paths.

Omega filters are known from various publications. In this connection, reference may be made to an article in Optik, Volume 43, page 495 (1975) by G. Zanchi et al wherein an apparatus is described which includes three magnets and three deflection regions, with deflection angles of 116°, 232° and 116°. Several publications for apparatus having four deflection regions and deflection angles of 90° or less are also known, for example: H. Rose et al, Optik, Volume 40, page 336 (1974); D. Krahl et al, Ninth International Congress on Electron Microscopy, Toronto, Volume 1, page 42 (1978); and, H. Wollnik et al, Optik, Volume 46, page 255 (1976).

To be optimally usable in an electron microscope, an imaging electron filter must meet the following two conditions: first, a large number of image points must be transmitted without loss of local resolution; and second, the imaging errors in the exit source plane (also called a selection plane) must be so slight that narrow energy widths (on the part of the transmitted electrons) can be realized.

In the electron filters known from the above publications, the attainable energy widths are unsatisfactory in each case; in many cases, the local resolution is inadequate as well.

From a publication by H. Rose et al in Optik, Volume 54, page 235 (1979), an apparatus is disclosed which likewise includes four deflection regions with deflection angles of 90°. By providing the pole pieces with curved edges and by providing three additional hexapoles, a virtually complete correction of the imaging errors is obtained. However, this apparatus has the disadvantage of high production cost, especially for the curved edges. Also, this electron filter is difficult to adjust because of the curved edges.

SUMMARY OF THE INVENTION

It is the object of the invention to provide an omega filter which has straight edges on the pole pieces, which has good local resolution and provides narrow energy widths and is adequate with the fewest possible hexapoles.

This object is attained in accordance with a feature of the invention by providing that the deflection angles are larger than 90°.

According to an advantageous embodiment of the invention, the deflection angles are in the range from $100° \leq \phi \leq 115°$.

The energy filter may have only four deflection angles for influencing the electron beam. For this embodiment, an advantageous range for the angles between the pole piece edges and the wave fronts of the electron beam are provided.

In a particularly advantageous embodiment, the peripheral fields that develop outside the edges of the pole pieces are substantially reduced by means of shielding plates (in the literature, these are sometimes referred to as mirror plates or field clamps). These shielding plates are disposed at least at the locations where the electron beam enters the deflection regions and leaves the deflection regions, the shielding plates being spaced by a slight distance from the pole-piece edges and preferably at the same elevation as the surfaces of the pole pieces.

In a further advantageous embodiment, the shielding plates and the pole pieces form one part, made for instance from soft iron, with the coils for generating the magnetic field being embedded in a continuous channel which separates the pole-piece surfaces from the surrounding shielding surfaces. This technology for producing homogeneous magnetic fields with small, defined peripheral fields is known from a work by A. V. Crewe et al in the Review of Scientific Instruments, Volume 42, page 411 (1971).

In another advantageous embodiment, a hexapole for influencing the electron beam is disposed, as an additional means for correcting imaging error, between the second and third deflection regions. In this case, advantageous ranges for the angles between the pole-piece edges and the wave fronts of the electron beam are disclosed. Also in this case, shielding plates that can be combined into one part with the pole pieces are used and provide a particularly advantageous embodiment.

Whether the embodiment is with or without the hexapole, a stigmatic image of the entry image plane is located in the center plane of the filter. In both embodiments, an achromatic and stigmatic image of the entry image plane is projected into the exit image plane on a scale of 1:1, and a dispersive and stigmatic image of the entry source plane is projected into the exit source plane.

A substantial advantage of the energy filters having shielding plates is that they are easy to adjust, and that good shielding from stray fields is provided.

BRIEF DESCRIPTION OF THE DRAWING

The invention will now be described with reference to the drawing wherein:

FIG. 3a is a section taken through a deflector system including two pole pieces with integrated shielding plates; and,
FIG. 3b is a plan view taken along line IIIb—IIIb of FIG. 3a of a pole piece having integrated shielding plates.

DESCRIPTION OF THE PREFERRED EMBODIMENTS OF THE INVENTION

Figure 1:
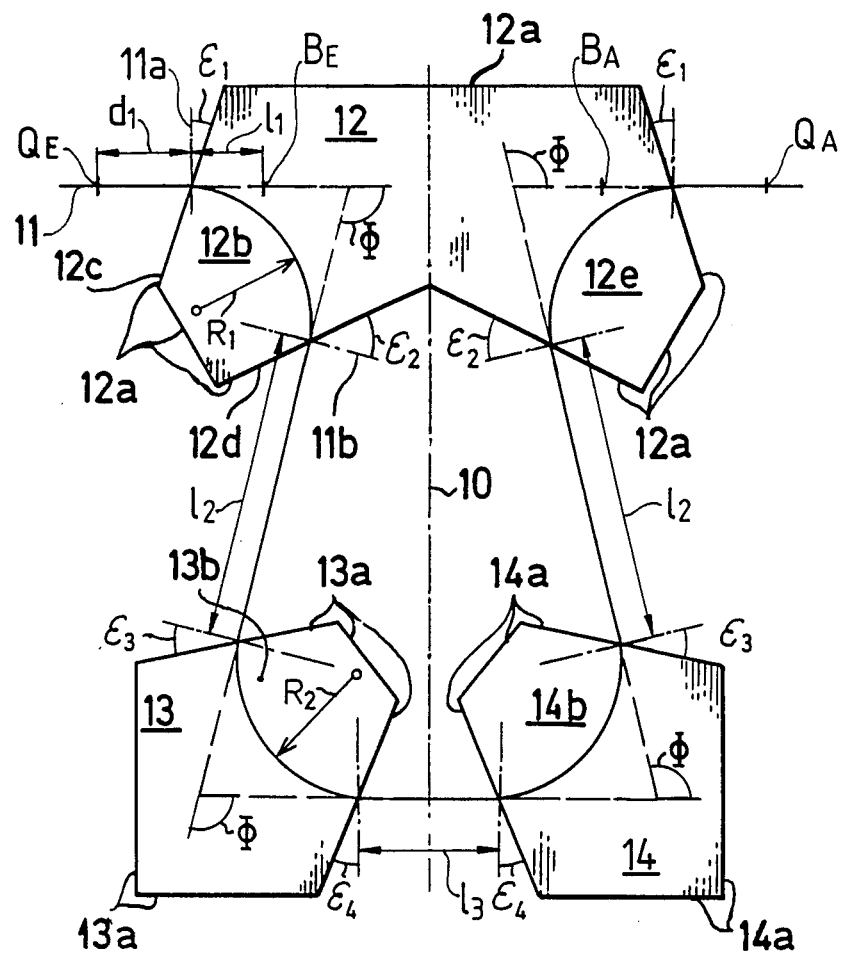
FIG. 1 shows an omega filter without a hexapole.
Figure 2:
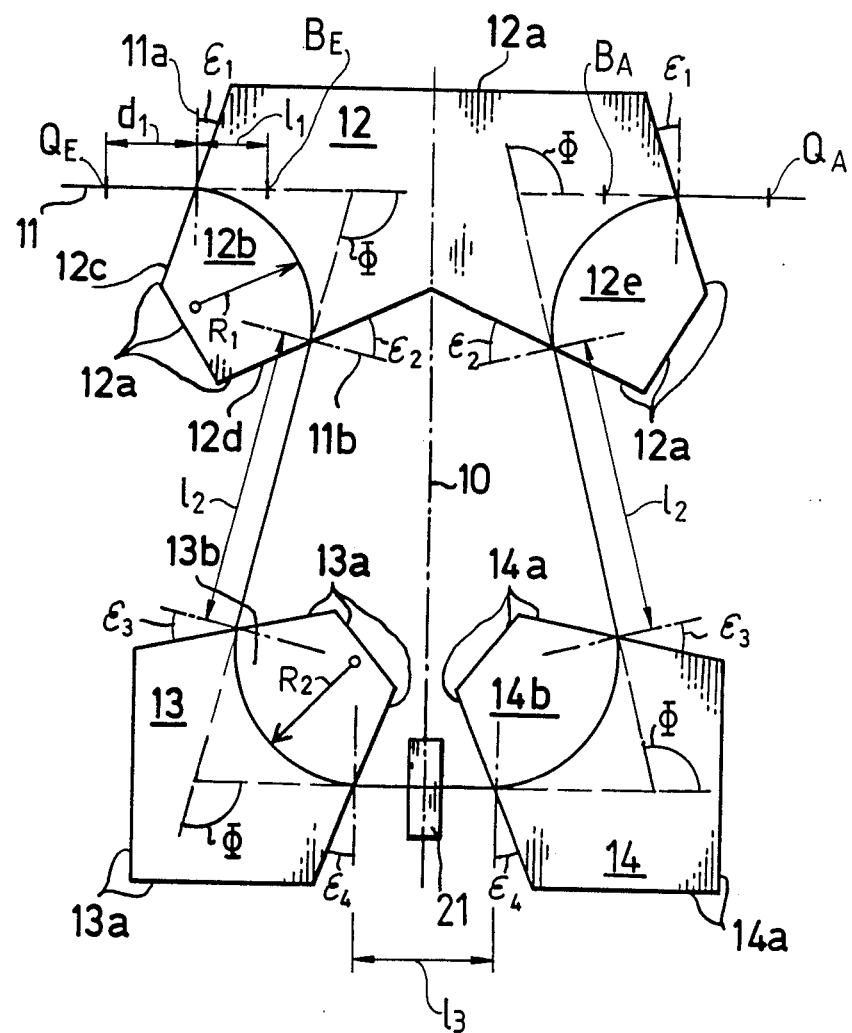
FIG. 2 shows an omega filter with a hexapole.

In FIGS. 1 and 2, the plane of the drawing is the plane in which the center axis 11 of the electron beam passes through the filter. Like all other known omega filters, these filters are also symmetrical with respect to the center plane, which is at right angles to the plane of the drawing and intersects the latter in the line 10. Located in this plane of symmetry is an intermediate image of the (virtual) entry image plane $B_E$, which is imaged by the omega filter into the (virtual) exit image plane $B_A$.

The filters shown in FIGS. 1 and 2 comprise magnets, of which the pole pieces 12, 13 and 14, located below the plane of the drawing, are shown along with their edges 12a, 13a and 14a. The pole pieces located below the plane of the drawing and those located thereabove are configured as mirror symmetrical with respect to the plane of the drawing. There are homogeneous magnetic fields between the mutually adjacent pole pieces, which deflect the electron beam by the angle $\phi$ in the deflection regions 12b, 13b, 14b and 12e onto circular paths having the deflection radii $R_1$ and $R_2$. The exact radii and angles are a function of the energy of the electrons, so that an energy spectrum from which some ranges can be masked out is created in the exit source plane $Q_A$.

Upon the entry of the electron beam 11 into the first deflection region 12b, the edge 12c of the pole piece 12 (and correspondingly, the edge, not shown, of the second pole piece for the magnetic field, which is mirror symmetrical with respect to the plane of the drawing) forms the angle $\epsilon_1$ with the direction 11a of the wave front of the electron beam 11. The angle $\epsilon_2$ is formed between the direction 11b of the wave front of the electron beam 11 emerging from the deflection region 12b and the edge 12d of the pole piece 12. Corresponding angles $\epsilon_3$ and $\epsilon_4$ are formed upon entry into and exit from the second deflection region 13b.

As the course of the electron beam continues, angles corresponding to those shown in FIG. 1 are provided because of the symmetrical configuration of the filter. By suitable selection of these angles conjointly defined by the wave fronts and the pole-piece edges, focusing of the electron beam even into the plane at right angles to the plane of the drawing can be attained. For good correction of imaging error, the following ranges have been found to be particularly advantageous, for the arrangement shown in FIG. 1:

$$100° \leq \phi \leq 115°$$

$$25° \leq \epsilon_1 \leq 40°$$

$$30° \leq \epsilon_2 \leq 45°$$

$$15° \leq \epsilon_3 \leq 30°$$

$$10° \leq \epsilon_4 \leq 35°$$

$$0.8 \leq R_2/R_1 \leq 1.6$$

The remaining geometrical dimensions of the energy filter $d_1$, $l_1$, $l_2$, $l_3$ and $R_2/R_1$ are necessarily obtained from the requirement for an at least approximately stigmatic image of the (virtual) entry image plane $B_E$ into the (virtual) exit image plane $B_A$ and of the entry source plane $Q_E$ into the exit source plane $Q_A$.

The pole pieces 12, 13 and 14 shown in FIG. 1 have very extensive peripheral fields, which influence the electron beam 11 even outside the deflection regions 12b, 13b, 14b and 12e. These peripheral fields can be reduced substantially by means of shielding plates. A particularly advantageous embodiment of this is shown in FIGS. 3a and 3b, in which the pole piece 32, which is equivalent to the pole piece 12 of FIG. 1, forms one integral part 30 together with the shielding plates. The part 30, like the second part 31 belonging to the deflector system, may for instance be of soft iron. Grooves 34 and 35 having the width S are machined into the respective parts 30 and 31 and their inner contour defines the shape of the respective pole pieces 32 and 33, for instance having the edges 32c and 33d. The outer contour of the grooves 34 and 35 forms the edges 40c and 40d, for example, of the shielding plate 38. A current flowing through the coils 36 and 37 located in the grooves 34 and 35 generates a homogeneous magnetic field between the pole pieces 32 and 33. In contrast, there is no magnetic field produced outside the grooves 34 and 35, so that the peripheral field is substantially limited to the width S of the grooves. In a suitable manner, the spacing D between the shielding plates 38 and 39, at the locations 41 through which the electron beam 11 passes, is of the same size as the spacing between the pole piece surfaces 32 and 33. This does not necessarily have to be the case, however. At the other locations 40, the shielding plates 38 and 39 are located immediately adjacent one another.

The greatest number of image points which are transmitted without any loss of local resolution, and the least errors in the exit source plane $Q_A$, so that low energy widths are attainable, are attained with the following values:

$\phi = 108°$ $\epsilon_1 = 32.0°$ $\epsilon_2 = 38.0°$ $\epsilon_3 = 24.5°$ $\epsilon_4 = 24.1°$ $R_2/R_1 = 1$ and with the following geometrical dimensions:

$d_1 = 1.00\ R_1$ $l_1 = 0.66\ R_1$ $l_2 = 2.52\ R_1$ $l_3 = 0.79\ R_1$ $S = 0.10\ R_1$ $D = 0.10\ R_1$

The above geometrical dimensions of the filter are standardized in such a way that by suitable selection of $R_1$, the sum of the distances $d_{1+l1}$ can be adapted to the distance between the source plane and the image plane, which is predetermined by the imaging system of whichever electron microscope is used.

FIG. 2 shows an omega filter of similar configuration, which differs from the filter shown in FIG. 1 in having somewhat different dimensions and in having a hexapole 21. Since the structure of the rest of the filter is similar, the same reference numerals as in FIG. 1 have been used in FIG. 2. By means of the hexapole (a magnetic system having six pole pieces, which are arranged radially with respect to the axis of the electron beam), which is known in electron optics, an even better correction of imaging error in the exit source plane $Q_4$ is possible, so that with the apparatus shown in FIG. 2, an improvement of the energy resolution by a factor of 1.6 is attained as compared with the apparatus shown in FIG. 1. In typical electron microscopes having a final image radius of 50 mm, energy widths $\Delta E$ of up to 2.1 eV are possible, as compared with 3.3 eV.

It will be appreciated that still further hexapoles can be disposed in the beam path; however, if the omega filter is dimensioned correctly, providing additional hexapoles cannot improve the imaging properties any further.

For the energy filter shown in FIG. 2, the following ranges have proved to be advantageous:

$100° \leq \phi \leq 115°$ $10° \leq \epsilon_1 \leq 30°$ $25° \leq \epsilon_2 \leq 45°$ $10° \leq \epsilon_3 \leq 30°$ $15° \leq \epsilon_4 \leq 35°$ $0.8 \leq R_2/R_1 \leq 1.6$ In this embodiment, it is once again particularly advantageous to reduce the extent of the peripheral fields by using shielding plates, as shown for instance in FIGS. 3a and 3b. The best image forming properties are obtained with the following values:

$\phi = 104°$ $\epsilon_1 = 18.0°$ $\epsilon_2 = 39.0°$ $\epsilon_3 = 27.5°$ $\epsilon_4 = 30.1°$ $R_2/R_1 = 1$ and with the following geometrical dimensions:

$d_1 = 1.03\ R_1$ $l_1 = 0.92\ R_1$ $l_2 = 2.43\ R_1$ $l_3 = 1.34\ R_1$ $S = 0.14\ R_1$ $D = 0.14\ R_1$

Naturally, in this case as well, an adaptation to any electron microscope that may be used can be accomplished by means of a suitable selection of $R_1$.

It is understood that the foregoing description is that of the preferred embodiments of the invention and that various changes and modifications may be made thereto without departing from the spirit and scope of the invention as defined in the appended claims.

What is claimed is:

1. An imaging magnetic electron-energy omega filter for an apparatus such as an electron microscope in which an electron beam is generated and transmitted along a straight-line beam path in a predetermined direction, the filter comprising: pole-piece means for generating four magnetic fields for acting on said electron beam to bend the same out of said beam path and through four deflection angles $\phi$ each of which is greater than 90° so as to return said beam to said beam path to continue in said direction.

2. The filter of claim 1, said deflection angles $\phi$ lying in the range $100° \leq \phi \leq 115°$; and, said pole-piece means being adapted to generate said magnetic fields to deflect said electron beam through a first curve having a deflection radius $R_1$ and then through a second curve having a deflection radius $R_2$, said deflection radii having a ratio $R_2/R_1$, in the range $0.8 \leq R_2/R_1 \leq 1.6$.

3. An imaging magnetic electron-energy omega filter for an apparatus such as an electron microscope in which an electron beam is generated, the omega filter comprising:
pole-piece means for generating four magnetic fields for acting on said electron beam so as to cause the latter to pass through four deflection angles $\phi$ each of which is greater than 90°;
said deflection angles $\phi$ lying in the range $100° \leq \phi \leq 115°$;
said pole-piece means being adapted to generate said magnetic fields to deflect said electron beam through a first curve having a deflection radius $R_1$ and then through a second curve having a deflection radius $R_2$, said deflection radii having a ratio of $R_2/R_1$, in the range $0.8 \leq R_2/R_1 \leq 1.6$;
the filter defining an entry source plane ($Q_E$), an entry image plane ($B_E$), an exit image plane ($B_A$) and an exit source plane ($Q_A$);
said pole-piece means including four pole-piece units for generating said four magnetic fields and thereby defining four deflection regions for deflection said beam through said four angles $\phi$; said four pole-piece units being arranged so as to act on said electron beam successively along the beam path through the filter and the first and second two pole-piece units along said path being arranged so as to be symmetrical with respect to the third and fourth pole-piece units, said pole-piece units each defining respective edges disposed transversely to said beam where said beam enters and exits from the magnetic field thereof;
the edges of said first pole-piece unit and the wave front of said beam conjointly defining respective angles $\epsilon_1$ and $\epsilon_2$;
the edges of said second pole-piece unit and the wave front of said beam conjointly defining respective angles $\epsilon_3$ and $\epsilon_4$;
said entry source plane ($Q_E$) being spaced from the entry edge of said first pole-piece unit by a dimension ($d_1$); the entry edge of said pole-piece unit being spaced a distance ($l_1$) from said entry image plane ($B_E$); the exit edge of said first pole-piece unit being spaced from the entry edge of said second pole-piece unit by a dimension ($l_2$); the exit edge of said second pole-piece unit being spaced from the entry edge of said third pole-piece unit by a dimension ($l_3$); the exit edge of said third pole-piece unit being spaced from the entry edge of said fourth pole-piece unit also by the dimension ($l_2$);
said angles ($\epsilon_1$, $\epsilon_2$, $\epsilon_3$ and $\epsilon_4$) having values in the following ranges:

$25° \leq \epsilon_1 \leq 40°$ $30° \leq \epsilon_2 \leq 45°$ $15° \leq \epsilon_3 \leq 30°$ $10° \leq \epsilon_4 \leq 35°$ and said dimensions ($d_1$, $l_1$, $l_2$, $l_3$) and said ratio ($R_2/R_1$) being selected so as to cause at least an approximate stigmatic imaging of said entry image plane ($B_E$) into said exit image plane ($B_A$) and so as to cause at least an approximate stigmatic imaging of said entry source plane ($Q_E$) into said exit image plane ($Q_A$).

4. The filter of claim 3, wherein each of said pole-piece units including two mutually adjacent pole pieces having respective pole faces facing each other and having respective peripheral edges; said filter further comprising shielding plate means for suppressing peripheral fields lying outside of said deflection regions, said shielding plate means being arranged ahead of the first one of said deflection regions and after the fourth one of said deflection regions as well as between each two mutually adjacent ones of said deflection regions; said shielding plate means having a surface at least approximately at the elevation of said pole faces and a peripheral edge at a narrow spacing (S) parallel to the peripheral edges of said pole pieces.

5. The filter of claim 4, said shielding plate means defining a spacing (D) at which said beam passes through said filter; said angles ($\phi$, $\epsilon_1$, $\epsilon_2$, $\epsilon_3$, $\epsilon_4$) having the following values:

$\phi = 108°$ $\epsilon_1 = 32.0°$ $\epsilon_2 = 38.0°$ $\epsilon_3 = 24.5°$ $\epsilon_4 = 24.1°$ with said ratio $R_2/R_1 = 1$, and said dimensions ($d_1$, $l_1$, $l_2$, $l_3$, S, D) having the following values:

$d_1 = 1.00 R_1$ $l_1 = 0.66 R_1$ $l_2 = 2.52 R_1$ $l_3 = 0.79 R_1$ $S = 0.10 R_1$ $D = 0.10 R_1$ said radius ($R_1$) being selected so that the sum of ($d_1 + l_1$) is equal to the spacing between said entry source plane ($Q_E$) and said entry image plane ($B_E$) as required by the imaging system of said electron microscope.

6. An imaging magnetic electron-energy omega filter for an apparatus such as an electron microscope in which an electron beam is generated, the omega filter comprising:

pole-piece means for generating four magnetic fields for acting on said electron beam so as to cause the latter to pass through four deflection angles $\phi$ each of which is greater than 90°;

said deflection angles $\phi$ lying in the range $100° \leq \phi \leq 115°$;

said pole-piece means being adapted to generate said magnetic fields to deflect said electron beam through a first curve having a deflection radius $R_1$ and then through a second curve having a deflection radius $R_2$, said deflection radii having a ratio of $R_2/R_1$, in the range $0.8 \leq R_2/R_1 \leq 1.6$;

said pole-piece means including four pole-piece units for generating said four magnetic fields and thereby defining four deflection regions for deflection said beam through said four angles $\phi$; and, a hexapole mounted between the second and third ones of said deflection regions.

7. The filter of claim 6, wherein the filter defines an entry source plane ($Q_E$), an entry image plane ($B_E$), an exit image plane ($B_A$) and an exit source plane ($Q_A$); said four pole-piece units being arranged so as to act on said electron beam successively along the beam path through the filter and the first and second two pole-piece units along said path being arranged so as to be symmetrical with respect to the third and fourth pole-piece units, said pole-piece units each defining respective edges disposed transversely to said beam where said beam enters and exits from the magnetic field thereof;

the edges of said first pole-piece unit and the wave front of said beam conjointly defining respective angles $\epsilon_1$ and $\epsilon_2$;

the edges of said second pole-piece unit and the wave front of said beam conjointly defining respective angles $\epsilon_3$ and $\epsilon_4$;

said entry source plane ($Q_E$) being spaced from the entry edge of said first pole-piece unit by a dimension ($d_1$); the entry edge of said pole-piece unit being spaced a distance ($l_1$) from said entry image plane ($B_E$); the exit edge of said first pole-piece unit being spaced from the entry edge of said second pole-piece unit by a dimension ($l_2$); the exit edge of said second pole-piece unit being spaced from the entry edge of said third pole-piece unit by a dimension ($l_3$); the exit edge of said third pole-piece unit being spaced from the entry edge of said fourth pole-piece unit also by the dimension ($l_2$);

said angles ($\epsilon_1$, $\epsilon_2$, $\epsilon_3$ and $\epsilon_4$) having values in the following ranges:

$10° \leq \epsilon_1 \leq 30°$ $25° \leq \epsilon_2 \leq 45°$ $10° \leq \epsilon_3 \leq 30°$ $15° \leq \epsilon_4 \leq 35°$ and said dimensions ($d_1$, $l_1$, $l_2$, $l_3$) and said ratio ($R_2/R_1$) being selected so as to cause at least an approximate stigmatic imaging of said entry image plane ($B_E$) in said exit image plane ($B_A$) and so as to cause at least an approximate stigmatic imaging of said entry source plane ($Q_E$) into said exit image plane ($Q_A$).

8. The filter of claim 7, wherein each of said pole-piece units including two mutually adjacent pole pieces having respective pole faces facing each other and having respective peripheral edges; said filter further comprising shielding plate means for suppressing peripheral fields lying outside of said deflection regions, said shielding plate means being arranged ahead of the first one of said deflection regions and after the fourth one of said deflection regions as well as between each two mutually adjacent ones of said deflection regions; said shielding plate means having a surface at least approximately at the elevation of said pole faces and a peripheral edge at a narrow spacing (S) parallel to the peripheral edges of said pole pieces.

9. The filter of claim 8, said shielding plate means defining a spacing (D) at which said beam passes through said filter; said angles ($\phi$, $\epsilon_1$, $\epsilon_2$, $\epsilon_3$, $\epsilon_4$) having the following values:

$\phi = 104°$ $\epsilon_1 = 18.0°$ $\epsilon_2 = 39.0°$ $\epsilon_3 = 27.5°$ $\epsilon_4 = 30.1°$ with said ratio $R_2/R_1 = 1$, and said dimensions ($d_1$, $l_1$, $l_2$, $l_3$, S, D) having the following values:

$d_1 = 1.03 R_1$ $l_1 = 0.92 R_1$ $l_2 = 2.43 R_1$ $l_3 = 1.34 R_1$ $S = 0.14 R_1$ $D = 0.14 R_1$ said radius ($R_1$) being selected so that the sum of ($d_1 + l_1$) is equal to the spacing between said entry source plane ($Q_E$) and said entry image plane ($B_E$) as required by the imaging system of said electron microscope.

* * * * *

UNITED STATES PATENT AND TRADEMARK OFFICE
CERTIFICATE OF CORRECTION

PATENT NO. : 4,740,704
DATED : April 26, 1988
INVENTOR(S) : Harald Rose and Stefan Lanio It is certified that error appears in the above-identified patent and that said Letters Patent is hereby corrected as shown below:

In column 7, lines 36 and 37: delete "deflection" and substitute -- deflecting -- therefor.

In column 9, line 10: delete "$100° \leq \phi 115°;$" and substitute -- $100° \leq \phi \leq 115°;$ -- therefor.

In column 9, lines 19 and 20: delete "deflection" and substitute -- deflecting -- therefor.

Signed and Sealed this

Twenty-second Day of August, 1989

Attest:

DONALD J. QUIGG

Attesting Officer

Commissioner of Patents and Trademarks